United States Patent [19]
Saitoh et al.

[11] Patent Number: 6,025,733
[45] Date of Patent: Feb. 15, 2000

[54] SEMICONDUCTOR MEMORY DEVICE

[75] Inventors: Tuyoshi Saitoh, Nagasaki; Akira Kitaguchi, Tokyo; Masaaki Matsuo, Nagasaki; Makoto Hatakenaka, Tokyo; Toshio Nakano, Tokyo; Yuko Sudo, Tokyo, all of Japan

[73] Assignee: Mitsubishi Denki Kabushiki Kaisha, Tokyo, Japan

[21] Appl. No.: 09/018,055

[22] Filed: Feb. 3, 1998

[30] Foreign Application Priority Data

Sep. 9, 1997 [JP] Japan ................................. 9-244370

[51] Int. Cl.$^7$ ....................................... G01R 31/26
[52] U.S. Cl. ........................ 324/763; 324/759; 324/765
[58] Field of Search .................................. 324/759, 763, 324/765, 158.1

[56] References Cited

U.S. PATENT DOCUMENTS 5,514,975 5/1996 Sartwell et al. .................... 324/763
5,670,890 9/1997 Colwell et al. ..................... 324/765

FOREIGN PATENT DOCUMENTS 7221147 8/1995 Japan .

*Primary Examiner*—Glenn W. Brown
*Attorney, Agent, or Firm*—Leydig, Voit & Mayer, Ltd.

[57] ABSTRACT

A semiconductor memory device includes two subcircuits each including a memory circuit, a semiconductor circuit, and a logical circuit. Connection pads are divided into only two parallel rows located along the outer periphery of the semiconductor memory device. Each of the pads may include a probe region against which a probe is pressed for testing the semiconductor memory circuit, and a wire region to which a wire is connected upon packaging.

3 Claims, 9 Drawing Sheets

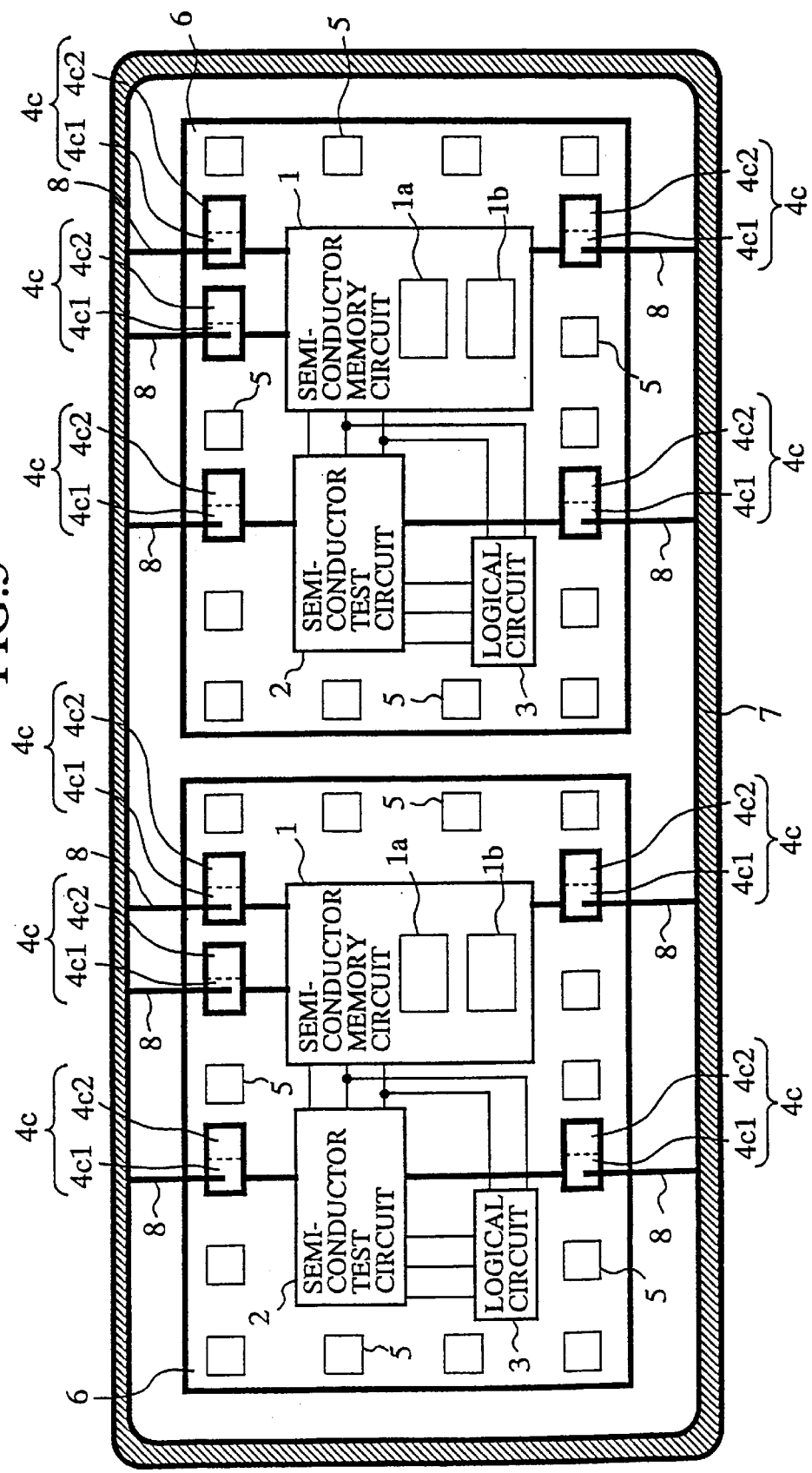

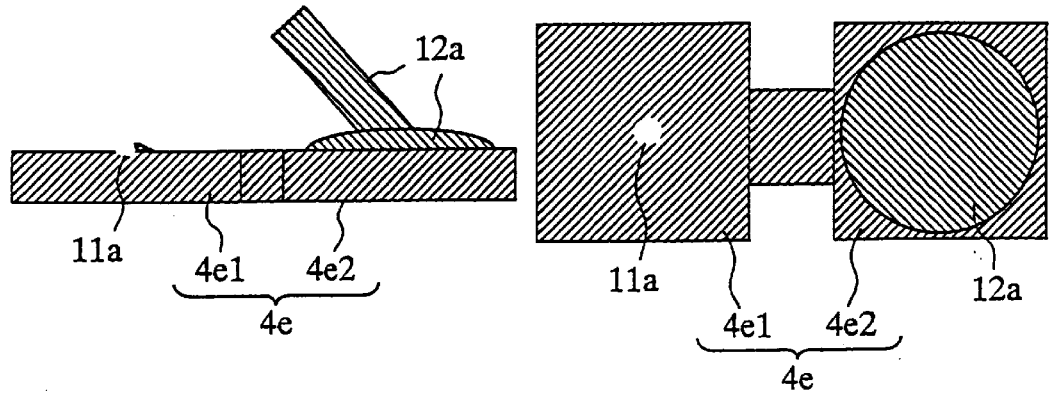
PRIOR ART
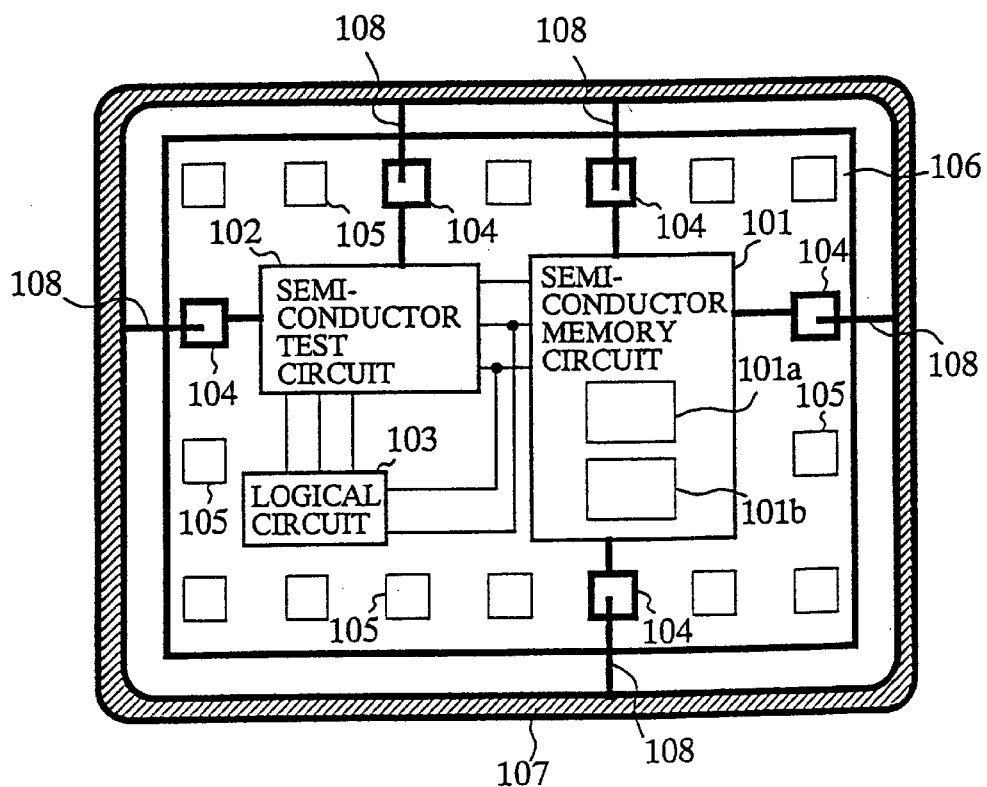

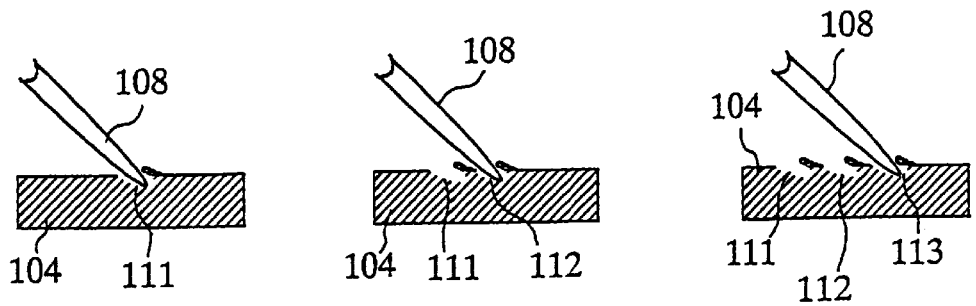
PRIOR ART FIG.11A  PRIOR ART FIG.11B  PRIOR ART FIG.11C
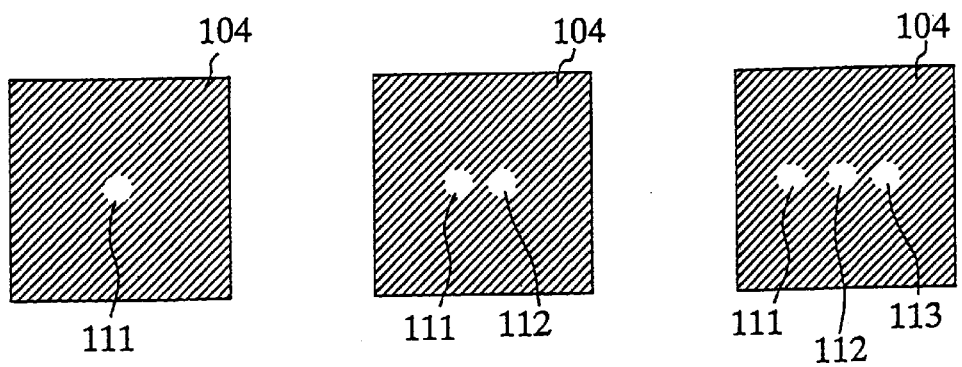
PRIOR ART FIG.12A  PRIOR ART FIG.12B  PRIOR ART FIG.12C
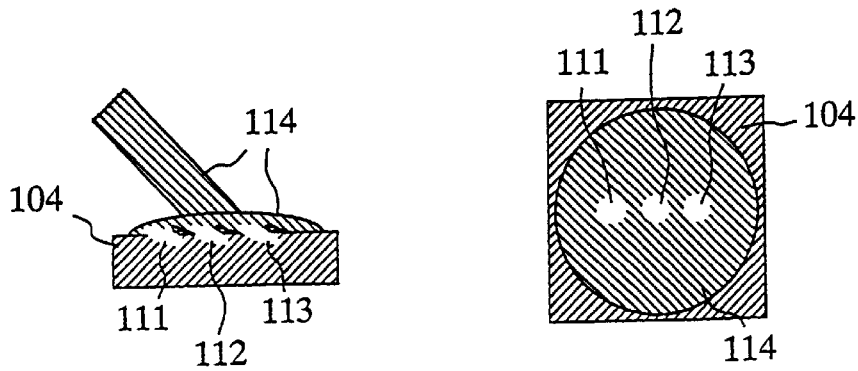
PRIOR ART FIG.13A  PRIOR ART FIG.13B

SEMICONDUCTOR MEMORY DEVICE

BACKGROUND OF THE INVENTION

1. Field of the Invention

The present invention relates to a semiconductor memory device having a semiconductor memory circuit, a semiconductor test circuit, a semiconductor circuit other than the semiconductor memory circuit and the semiconductor test circuit, and a plurality of pads against which probes are respectively pressed upon testing the semiconductor memory circuits and to which wires for connecting lead terminals are respectively electrically connected upon packaging, all of which are provided on the same substrate.

2. Description of the Prior Art

FIG. 10 is a plan view showing a configuration of a conventional semiconductor memory device. FIG. 10 illustrates the manner in which a semiconductor memory circuit is being tested while pressing probes against five first pads provided at one of a plurality of semiconductor memory devices formed on a semiconductor wafer, viewed through a window hole defined substantially in the center of a probe card. The plurality of semiconductor memory devices formed on the semiconductor wafer are divided into respective semiconductor memory devices in the subsequent dicing process. In FIG. 10, reference numeral 101 denotes a semiconductor memory circuit including an originally-used first memory circuit 101a and a second memory circuit 101b used in place of the first memory circuit 101a when the first memory circuit 101a fails to function properly. Reference numeral 102 denotes a semiconductor test circuit for testing the semiconductor memory circuit 101. Reference numeral 103 denotes a logical circuit for swapping data with the semiconductor memory circuit 101. Reference numerals 104 respectively denote first pads against which probes are respectively pressed upon testing the semiconductor memory circuit 101 and to which wires for connecting to lead terminals are respectively electrically connected upon packaging. Reference numerals 105 respectively denote second pads that are not in contact with the probes upon testing the semiconductor memory circuit 101 but electrically connected with wires for connecting to lead terminals upon packaging. Reference numeral 106 denotes a substrate provided with the semiconductor memory circuit 101, the semiconductor test circuit 102, the logical circuit 103, and the first and second pads 104 and 105. Further, reference numeral 107 denotes a probe card and reference numerals 108 denote probes attached to the probe card 107. Incidentally, reference numerals 105 are assigned only to parts of the second pads in FIG. 10. For brevity of illustration, the wires electrically connected to the second pads 105 are omitted and not shown in the drawing.

The conventional semiconductor memory device is shaped in the form of a square. The five first pads 104 are divided into groups of two pads, one pad, one and one pad placed along the four sides of the outer periphery of the semiconductor memory device.

The operation of the semiconductor memory device will next be described.

FIGS. 11A through 11C are respectively schematic side views showing the states of first pads 104 and probes 108 at the time that the probes 108 are respectively pressed against the first pads 104 in a test process of the semiconductor memory circuit. FIGS. 12A through 12C are respectively schematic plan views showing the states of the first pads 104 at the time that the probes 108 are respectively pressed against the first pads 104 and thereafter the probes 108 are respectively removed from the first pads 104 in the test process of the semiconductor memory circuit.

When the semiconductor memory circuit is tested, the probes 108 are first respectively pressed against the first pads 104 placed along the four sides of the outer periphery of the semiconductor memory circuit. Next, a test is made as to whether the first memory circuit 101a operates properly. In this case, a first probe contact trace 111 is developed in the first pad 104 by pressing the probe 108 against the first pad 104 (see FIG. 11A). Therefore, when the probe 108 is removed from the first pad 104, the first probe contact trace 111 remains in the first pad 104 (see FIG. 12A).

Thereafter, when the first memory circuit 101a fails to operate properly, the first memory circuit 101a is switched to the second memory circuit 101b and the probes 108 are respectively pressed against the first pads 104 disposed along the four sides of the outer periphery again. Next, a test is made as to whether the second memory circuit 101b operates properly. In this case, a second probe contact trace 112 occurs in the first pad 104 by pressing the probe 108 against the first pad 104 (see FIG. 11B). Therefore, the second probe contact trace 112 thereafter remains in the first pad 104 when the probe 108 is removed from the first pad 104 (see FIG. 12B).

Thereafter, when the second memory circuit 101b functions properly, the probes 108 are respectively pressed against the first and second pads 104 and 105. Next, a test is made as to whether the entire semiconductor memory device operates properly. In this case, a third probe contact trace 113 is developed in the first pad 104 by pressing the probe 108 against the first pad 104 (see FIG. 11C). Therefore, the third probe contact trace 113 thereafter remains in the first pad 104 when the probe 108 is removed from the first pad 104 (see FIG. 12C).

Since the conventional semiconductor memory device is constructed as described above, a problem arises in that in the test process of the semiconductor memory circuit, the probes 108 must be pressed against the first pads 104 placed along the four sides of the outer periphery thereof from four directions and a plurality of semiconductor memory devices cannot be tested simultaneously upon testing the semiconductor memory circuit.

Further, a problem arises in that since the first through third probe contact traces 111 through 113 remain in the first pads 108 respectively after the test process of the semiconductor memory circuit when the first memory circuit 101a fails to function properly, a wire 114 for connecting to a lead terminal is hard to connect to its corresponding first pad 104 upon packaging as shown in FIGS. 13A and 13B. FIG. 13 is a schematic view showing the state of the first pad 104 and the wire 114 at the time that the wire 114 for connecting to the lead terminal is electrically connected to the first pad 104, in which FIG. 13A is a side view and FIG. 13B is a plan view.

SUMMARY OF THE INVENTION

The present invention has been accomplished for solving the above-mentioned problems and it is an object of the present invention to provide a semiconductor memory device wherein when semiconductor memory circuits are tested, a plurality of semiconductor memory devices can be tested simultaneously.

It is another object of the present invention to provide a semiconductor memory device wherein wires for connecting to lead terminals are no longer hard to connect their corresponding pads upon packaging.

According to a first aspect of this invention, there is provided a semiconductor memory device wherein a plurality of pads are placed in one or two rows in parallel with one side of the outer periphery of the semiconductor memory device.

According to the first aspect, an advantageous effect can be obtained in that since the plurality of pads are arranged in one or two rows in parallel with one side of the outer periphery of the semiconductor memory device, a plurality of semiconductor memory devices can be tested simultaneously when semiconductor memory circuits are tested.

According to a second aspect of this invention, there is provided a semiconductor memory device wherein a plurality of pads are placed in two or more rows in parallel with one side of the outer periphery of the semiconductor memory device so that row coordinates of the pads differ from each other.

According to the second aspect, an advantageous effect can be brought about in that since the plurality of pads are disposed in two or more rows in parallel with one side of the outer periphery of the semiconductor memory device so that the row coordinates of the pads are rendered different from each other, a plurality of semiconductor memory devices can be tested simultaneously when semiconductor memory circuits are tested.

According to a third aspect of this invention, there is provided a semiconductor memory device wherein each of pads comprises a probe region against which a probe is pressed and a wire region to which a wire is electrically connected.

According to the third aspect, an advantageous effect can be obtained in that since each of the pads comprises the probe region against which the probe is pressed and the wire region to which the wire is electrically connected, the wire for connecting to a lead terminal is no longer hard to connect to the pad upon packaging.

According to a fourth aspect of this invention, there is provided a semiconductor memory device wherein a plurality of pads are placed in one or two rows in parallel with one side of the outer periphery of the semiconductor memory device and each of the pads comprises a probe region against which a probe is pressed and a wire region to which a wire is electrically connected.

According to the fourth aspect, an advantageous effect can be brought about in that since each of the pads is made up of the probe region against which the probe is pressed and the wire region to which the wire is electrically connected, the wire for connecting to a lead terminal is no longer hard to connect to the pad upon packaging.

According to a fifth aspect of this invention, there is provided a semiconductor memory device wherein a plurality of pads are placed in two or more rows in parallel with one side of the outer periphery of the semiconductor memory device so that row coordinates of the respective pads are made different from one another, and each of the pads comprises a probe region against which a probe is pressed and a wire region to which a wire is electrically connected.

According to the fifth aspect, an advantageous effect can be brought about in that since each of the pads comprises the probe region against which the probe is pressed, and the wire region to which the wire is electrically connected, the wire for connecting to a lead terminal is no longer hard to connect the pad upon packaging.

According to a sixth aspect of this invention, there is provided a semiconductor memory device wherein a plurality of pads are placed in one or two rows in parallel with one side of the outer periphery of the semiconductor memory device, and each of the pads comprises a probe pad against which a probe is pressed and a wire pad to which a wire is electrically connected, both of which are electrically connected to each other.

According to the sixth embodiment, an advantageous effect can be brought about in that since each of the pads comprises the probe pad electrically connected to the wire pad, against which the probe is pressed, and the wire pad connected with the wire, the wire for connecting to a lead terminal is no longer hard to connect to the pad upon packaging.

According to a seventh aspect of this invention, there is provided a semiconductor memory device wherein a plurality of pads are arranged in two or more rows in parallel with one side of the outer periphery of the semiconductor memory device so that row coordinates of the respective pads are rendered different from one another, and each of the pads comprises a probe pad against which a probe is pressed and a wire pad to which a wire is electrically connected, both of which are electrically connected to one another.

According to the seventh aspect, an advantageous effect can be brought about in that since each of the pads comprises the probe pad electrically connected to the wire pad, against which the probe is pressed, and the wire pad to which the wire is electrically connected, the wire for connecting to a lead terminal is no longer hard to connect to the pad upon packaging.

BRIEF DESCRIPTION OF THE DRAWINGS

FIG. 5 is a plan view illustrating a configuration of a semiconductor memory device according to a fourth embodiment of the present invention;

FIGS. 8A and 8B are schematic views illustrating the state of a first pad and a wire employed to describe the sixth embodiment of the present invention at the time that the wire for connecting to a lead terminal is electrically connected to the first pad;

FIG. 10 is a plan view showing a configuration of a conventional semiconductor memory device;

FIGS. 11A through 11C are schematic side views illustrating the states of first pads and probes employed in the conventional description at the time that the probes are respectively pressed against the first pads in a test process of a semiconductor memory circuit;

FIGS. 12A through 12C are schematic plan views depicting the states of the first pads shown in FIGS. 11A through 11C at the time that in the test process of the semiconductor memory circuit, the probes are respectively pressed against the first pads and thereafter the probes are respectively removed from the first pads; and FIGS. 13A and 13B are schematic views showing the state of a first pad and a wire used for the conventional description at the time that the wire for connecting to a lead terminal is electrically connected to the first pad.

DETAILED DESCRIPTION OF THE PREFERRED EMBODIMENTS

Embodiments of the present invention will be described below.

First Embodiment

Figure 1:
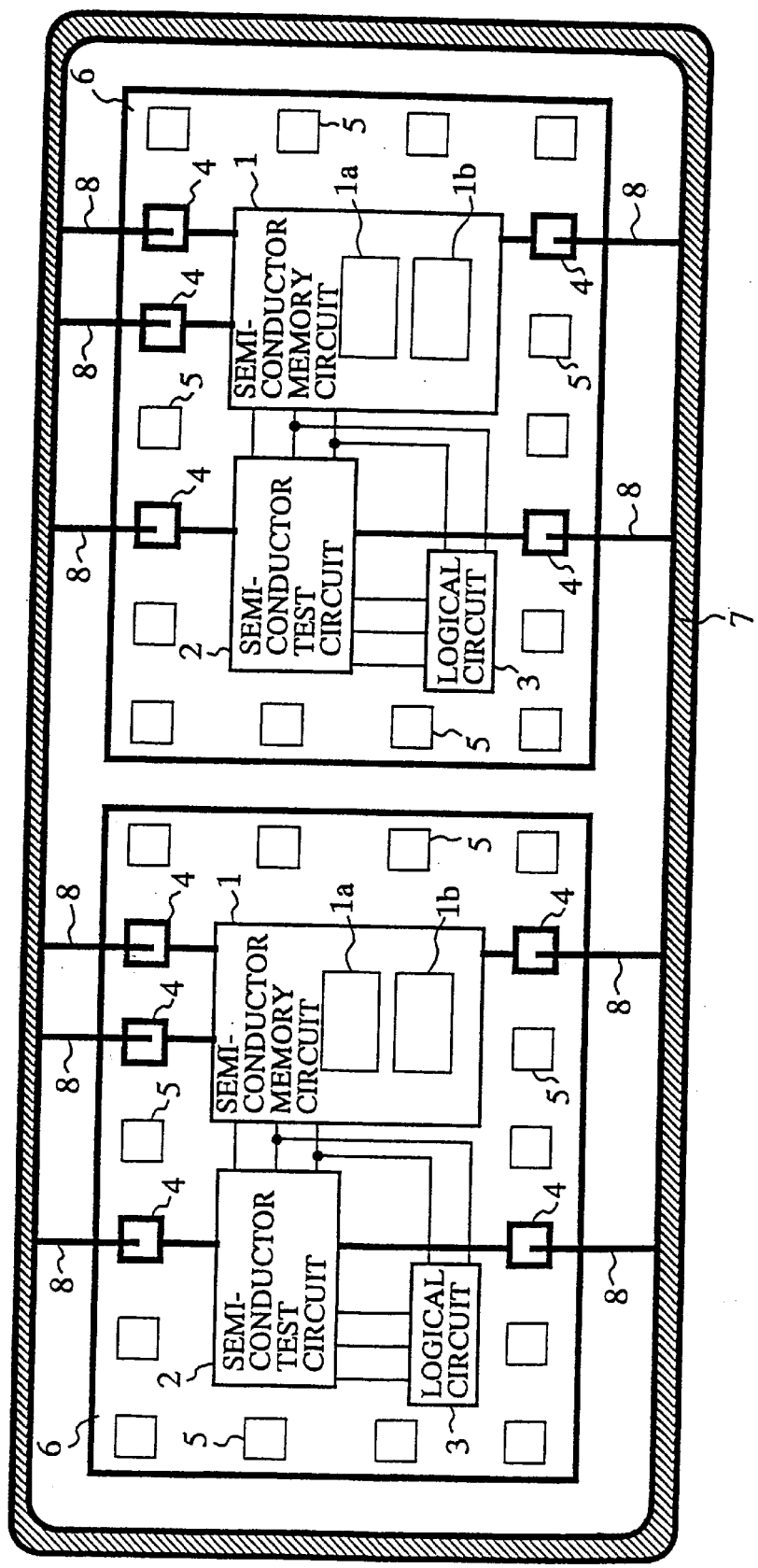
FIG. 1 is a plan view showing a configuration of a semiconductor memory device according to a first embodiment of the present invention.

FIG. 1 is a plan view showing a configuration of a semiconductor memory device according to a first embodiment of the present invention. FIG. 1 shows the manner in which semiconductor memory circuits are being tested while pressing probes against five first pads respectively provided at two semiconductor memory devices of a plurality of semiconductor memory devices formed on a semiconductor wafer, viewed through a window slot or hole defined substantially in the center of a probe card. The plurality of semiconductor memory devices formed on the semiconductor wafer are divided into respective semiconductor memory devices in the subsequent dicing process. In FIG. 1, reference numerals 1 denote semiconductor memory circuits, each including an originally-used first memory circuit 1a and a second memory circuit 1b used in place of the first memory circuit 1a when the first memory circuit 1a fails to function properly. Reference numerals 2 denote semiconductor test circuits for testing the semiconductor memory circuits 1, respectively. Reference numerals 3 respectively denote logical circuits (semiconductor circuits) for swapping data with the semiconductor memory circuits 1. Reference numerals 4 respectively denote first pads (pads) against which probes are respectively pressed upon testing the semiconductor memory circuits 1 and to which wires for connecting to lead terminals are respectively electrically connected upon packaging. Reference numerals 5 denote second pads that are not in contact with the probes upon testing the semiconductor memory circuits 1 but are electrically connected with wires for connecting to lead terminals upon packaging. Reference numerals 6 denote substrates, each provided with the semiconductor memory circuit 1, the semiconductor test circuit 2, the logical circuit 3, and the first and second pads 4 and 5. Further, reference numeral 7 denotes a probe card and reference numerals 8 respectively denote probes attached to the probe card 7. Incidentally, reference numerals 5 are assigned only to parts of the second pads in FIG. 1. For brevity of illustration, the wires electrically connected to the second pads are omitted and not shown in the drawing.

The semiconductor memory device according to the first embodiment of the present invention is shaped in the form of a square. The five first pads 4 are classified or divided into two and three and arranged in two rows so as to run parallel with one side of the outer periphery of the semiconductor memory device. Since the semiconductor memory device is shaped in square form, the first pads 4 are disposed so as to run parallel to the opposite two sides of the outer periphery thereof as a result of the placement of the first pads 4 in parallel with one side of the outer periphery thereof.

The operation of the present embodiment will next be described.

When the semiconductor memory circuit is tested, the probes 8 are respectively pressed against the first pads 4 respectively disposed within the two semiconductor devices continuously located in the direction in which the first pads 4 are in a row. In this condition, the two semiconductor memory devices are simultaneously tested. Since the five first pads 4 are divided into groups of two and three and arranged in two rows parallel to one side of the outer periphery, the probes 8 are pressed against the respective semiconductor memory devices from two directions opposed to each other.

Thus, the first embodiment can obtain an advantageous effect in that since the five first pads 4 are divided into groups of two and three pads and disposed in two rows parallel to one side of the outer periphery, the two semiconductor memory devices can be simultaneously tested upon testing the semiconductor memory circuits.

Second Embodiment

Figure 2:
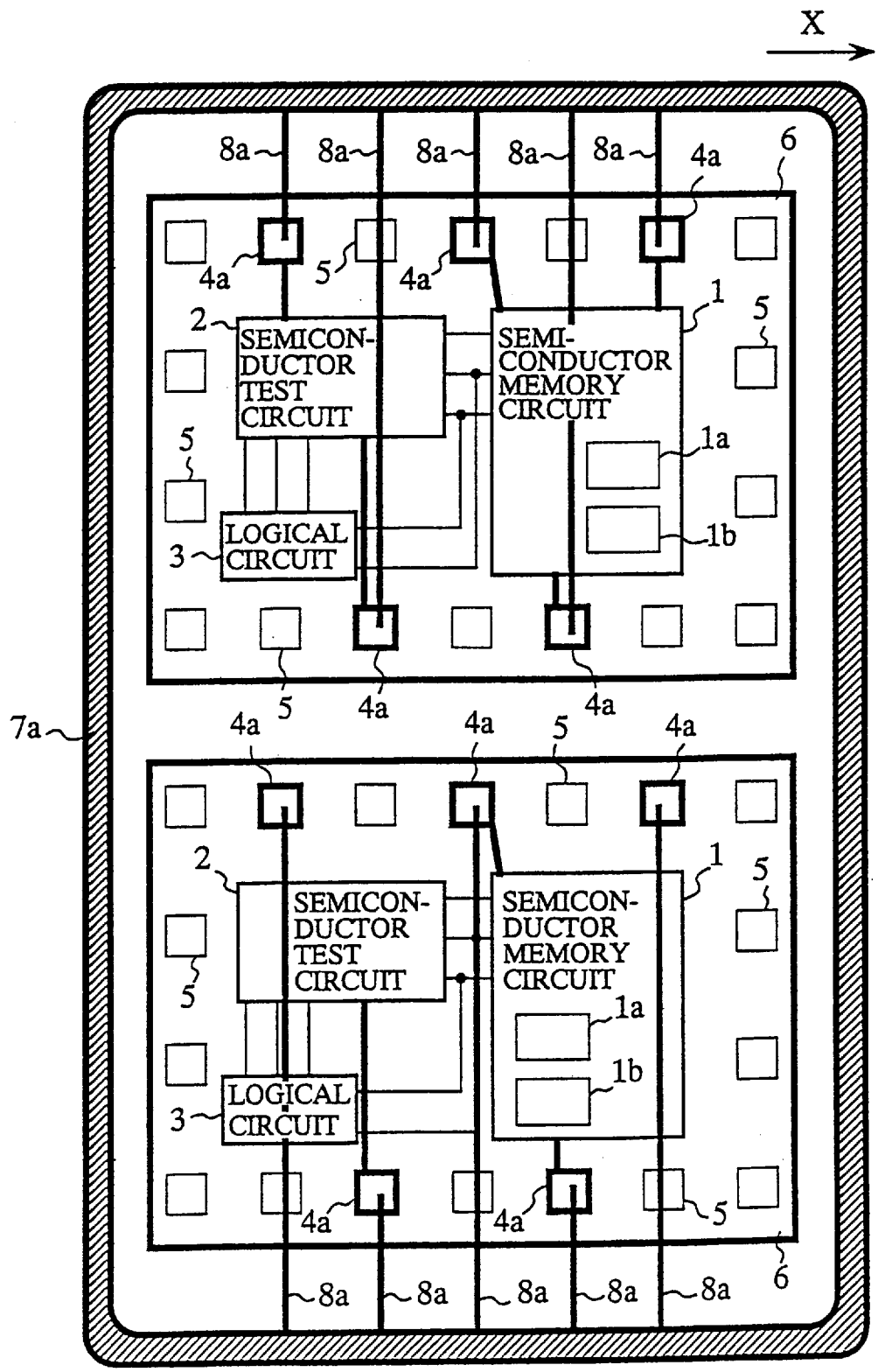
FIG. 2 is a plan view illustrating a configuration of a semiconductor memory device according to a second embodiment of the present invention.

FIG. 2 is a plan view showing a configuration of a semiconductor memory device according to a second embodiment of the present invention. FIG. 2 shows the manner in which semiconductor memory circuits are being tested while pressing probes against five first pads respectively provided at two semiconductor memory devices of a plurality of semiconductor memory devices formed on a semiconductor wafer, viewed through a window hole defined substantially in the center of a probe card. The plurality of semiconductor memory devices formed on the semiconductor wafer are divided into individual semiconductor memory devices in the subsequent dicing process. In FIG. 2, reference numerals 4a respectively denote first pads (pads) against which probes are respectively pressed upon testing semiconductor memory circuits 1 and to which wires for connecting to lead terminals are respectively electrically connected upon packaging. Reference numeral 7a denotes a probe card and reference numerals 8a respectively denote probes attached to the probe card 7a. Since the second embodiment is identical or similar in other configuration to the first embodiment, its detailed description will be omitted.

The semiconductor memory device according to the second embodiment of the present invention is shaped in the form of a square. The five first pads 4a are divided into groups of two pads and three pad and arranged in two rows in parallel with one side of the outer periphery of the semiconductor memory device. Since the semiconductor memory device is shaped in square form, the first pads 4a are placed in parallel with the opposed two sides of the outer periphery thereof as a result of the placement of the first pads 4a in parallel with one side of the outer periphery thereof. Further, the five first pads 4a are disposed so that row coordinates (corresponding to coordinates in the direction indicated by X in FIG. 2) of the respective first pads 4a differ from each other.

The operation of the present embodiment will next be described.

When the semiconductor memory circuit is tested, the probes 8a are respectively pressed against the first pads 4a respectively disposed within the two semiconductor memory devices continuously located in the direction normal to the direction in which the first pads 4a are in a line.

In this condition, the two semiconductor memory devices are simultaneously tested. Since the five first pads 4a are divided into groups of two and three and arranged in two rows parallel to one side of the outer periphery and the five first pads 4a are placed so that the row coordinates of the respective first pads 4a differ from each other, the probes 8a are pressed against one semiconductor memory device from one of the opposed two directions, whereas the probes 8a are pressed against the other semiconductor memory device from the other of the opposed two directions.

Thus, the second embodiment can obtain an advantageous effect in that since the five first pads 4a are divided into groups of two and three and disposed in two rows so as to run parallel with one side of the outer periphery and the five first pads 4a are placed so that the row coordinates of the respective first pads 4a differ from one another, the two semiconductor memory devices can be simultaneously tested upon testing the semiconductor memory circuits.

Third Embodiment

Figure 3:
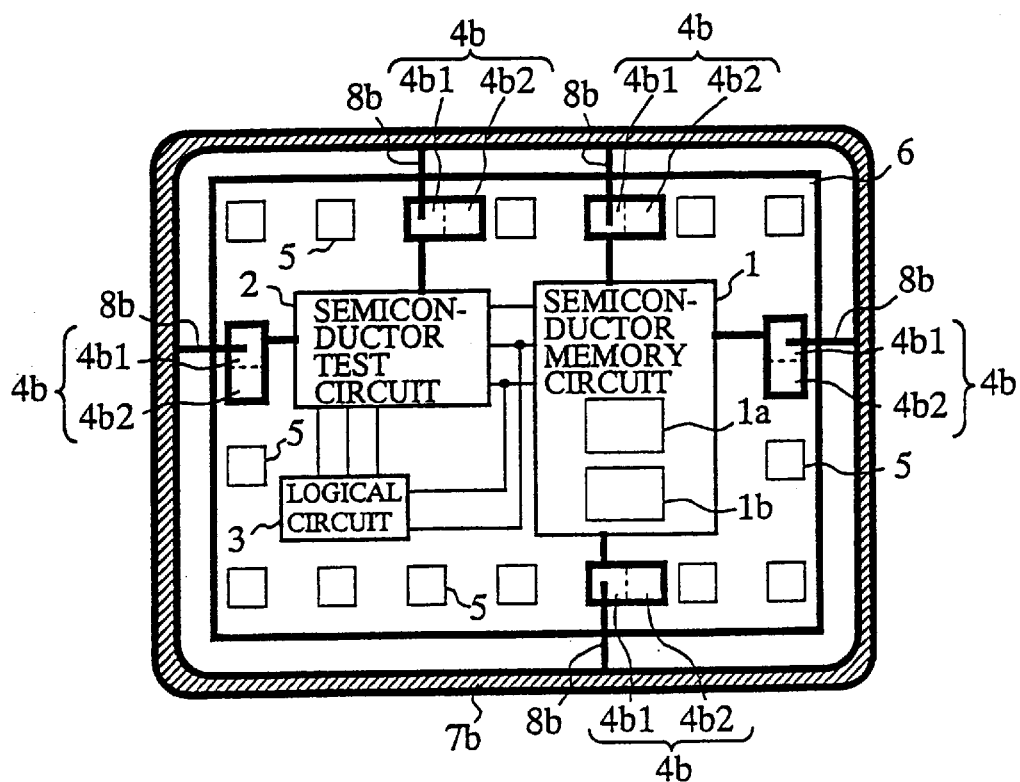
FIG. 3 plan view depicting a configuration of a semiconductor memory device according to a third embodiment of the present invention.

FIG. 3 is a plan view showing a configuration of a semiconductor memory device according to a third embodiment of the present invention. FIG. 3 illustrates the manner in which a semiconductor memory circuit is being tested while pressing probes against five first pads provided at one of a plurality of semiconductor memory devices formed on a semiconductor wafer, viewed through a window hole defined substantially in the center of a probe card. The plurality of semiconductor memory devices formed on the semiconductor wafer are divided into individual semiconductor memory devices in the subsequent dicing process. In FIG. 3, reference numerals 4b respectively denote first pads (pads) against which probes are respectively pressed upon testing a semiconductor memory circuit 1 and to which wires for connecting to lead terminals are respectively electrically connected upon packaging. Reference numeral 7b denotes a probe card and reference numerals 8b respectively denote probes attached to the probe card 7b. Since the third embodiment is identical or similar in other configuration to the first embodiment, its detailed description will be omitted.

The semiconductor memory device according to the third embodiment of the present invention is shaped in the form of a square. The five first pads 4b are divided into groups of two pads, one pad, one pad and one pad arranged along the four sides of the outer periphery of the semiconductor memory device. Each of the first pads 4b comprises a probe region 4b1 against which a probe is pressed upon testing the semiconductor memory circuit 1, and a wire region 4b2 to which a wire for connecting to the lead terminal is electrically connected upon packaging. Each first pad 4b is greater than usual in area.

The operation of the present embodiment will next be described.

When the semiconductor memory circuit is tested, the probes 8b are respectively pressed against the probe regions 4b1 of the first pads 4b. In this condition, the semiconductor memory device is tested one by one. Since the five first pads 4b are divided into two, one, one and one and disposed along the four sides of the outer periphery of the semiconductor memory device in the semiconductor memory device, the probes 8b are pressed against the semiconductor memory device from four directions.

Figure 4A:
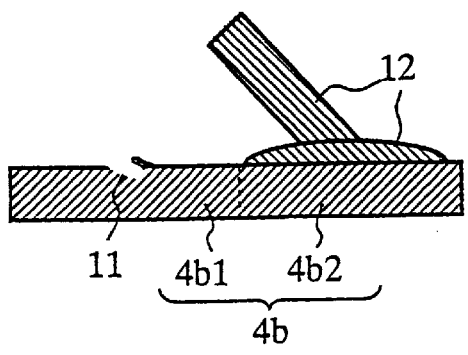
FIGS. 4A and 4B are schematic views showing the state of a first pad and a wire used to describe the third embodiment of the present invention at the time that the wire for connecting to a lead terminal is electrically connected to the first pad.
Figure 4B:
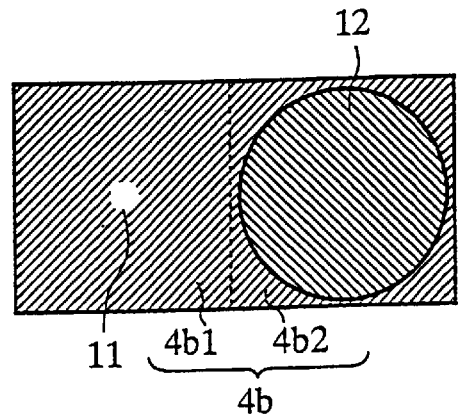

Thus, the third embodiment can bring about an advantageous effect in that since each of the first pads 4b comprises the probe region 4b1 against which the probe is pressed upon testing the semiconductor memory circuit 1 and the wire region 4b2 to which the wire for connecting to the lead terminal is electrically connected upon packaging, a wire 12 for connecting to the lead terminal can be electrically connected to the wire region 4b2 different from the probe region 4b1 provided with a probe contact trace 11 produced by pressing the probe against the probe region 4b1, and the wire 12 for connecting to the lead terminal is no longer hard to connect to the first pad 4b, as shown in FIGS. 4A and 4B. Incidentally, FIG. 4 is a schematic view showing the state of the first pad 4b and the wire 12 at the time that the wire 12 for connecting to the lead terminal is electrically connected to the first pad 4b, wherein FIG. 4A is a side view and FIG. 4B is a plan view.

Fourth Embodiment

FIG. 5 is a plan view showing a configuration of a semiconductor memory device according to a fourth embodiment of the present invention. FIG. 5 illustrates the manner in which semiconductor memory circuits are being tested while pressing probes against five first pads respectively provided at two of a plurality of semiconductor memory devices formed on a semiconductor wafer, viewed through a window hole defined substantially in the center of a probe card. The plurality of semiconductor memory devices formed on the semiconductor wafer are divided into individual semiconductor memory devices in the subsequent dicing process. In FIG. 5, reference numerals 4c respectively denote first pads (pads) against which probes are respectively pressed upon testing semiconductor memory circuits 1 and to which wires for connecting to lead terminals are respectively electrically connected upon packaging. Since the remaining configuration of the fourth embodiment is similar to the first embodiment, its detailed description will be omitted.

The semiconductor memory device according to the fourth embodiment of the present invention is shaped in square form. The five first pads 4c are divided into two and three and arranged in two rows to run parallel with one side of the outer periphery of the semiconductor memory device. Since the semiconductor memory device is square-shaped, the first pads 4c are disposed in parallel with the opposite two sides of the outer periphery thereof as a result of the placement of the first pads 4c in parallel with one side of the outer periphery thereof. Further, each of the first pads 4c comprises a probe region 4c1 against which a probe is pressed upon testing the semiconductor memory circuit 1, and a wire region 4c2 to which a wire for connecting to the lead terminal is electrically connected upon packaging. Each first pad 4c is greater than one employed in the prior art in area.

The operation of the present embodiment will next be described.

When the semiconductor memory circuit is tested, the probes 8 are respectively pressed against the probe regions 4c1 of the first pads 4c respectively disposed within the two semiconductor memory devices continuously located in the direction in which the first pads 4c are in a row. In this condition, the two semiconductor memory devices are simultaneously tested. Since the five first pads 4c are divided into groups of two and three pads arranged in two rows parallel to one side of the outer periphery in each semiconductor memory device, the probes 8 are pressed against the respective semiconductor memory devices from two directions opposed to each other.

Thus, the fourth embodiment can obtain an advantageous effect in that since the five first pads 4c are divided into groups of two and three pads disposed in two rows parallel to one side of the outer periphery, the two semiconductor memory devices can be simultaneously tested upon testing the semiconductor memory circuits.

Further, the fourth embodiment can bring about an advantageous effect in that since each of the first pads 4c comprises the probe region 4c1 against which the probe is pressed upon testing the semiconductor memory circuit 1 and the wire region 4c2 to which the wire for connecting to the lead terminal is electrically connected upon packaging, the wire for connecting to the lead terminal can be electrically connected to the wire region 4c2 different from the probe region 4c1 provided with a probe contact trace produced by pressing the probe against the probe region 4c1, and the wire for connecting to the lead terminal is no longer hard to connect to the first pad 4c, in a manner similar to the third embodiment (see FIGS. 4A and 4B).

Fifth Embodiment

Figure 6:
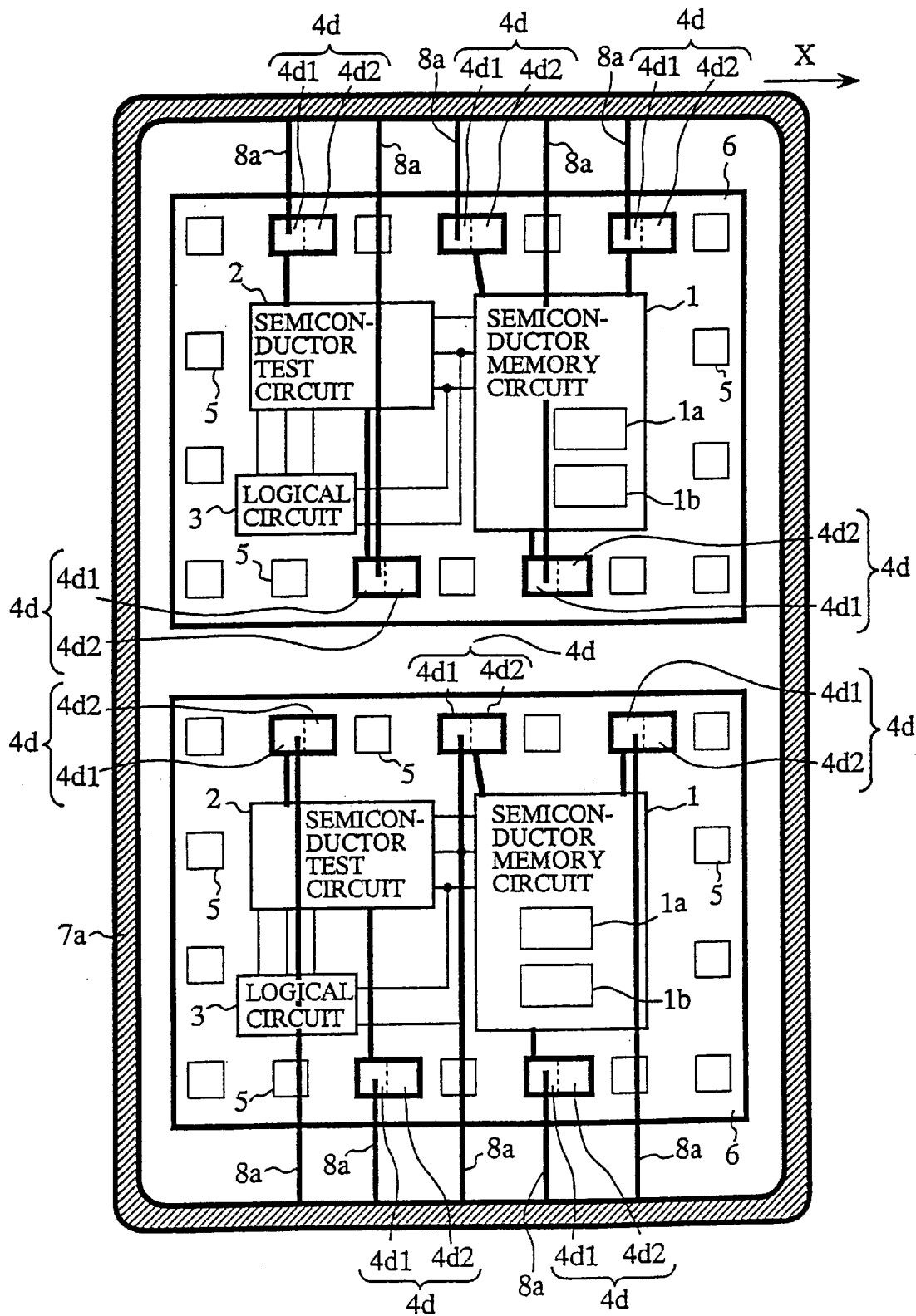
FIG. 6 is a plan view depicting a configuration of a semiconductor memory device according to a fifth embodiment of the present invention.

FIG. 6 is a plan view showing a configuration of a semiconductor memory device according to a fifth embodiment of the present invention. FIG. 6 illustrates the manner in which semiconductor memory circuits are being tested while pressing probes against five first pads respectively provided at two of a plurality of semiconductor memory devices formed on a semiconductor wafer, is viewed through a window hole defined substantially in the center of a probe card. The plurality of semiconductor memory devices formed on the semiconductor wafer are divided into individual semiconductor memory devices in the subsequent dicing process. In FIG. 6, reference numerals 4d respectively denote first pads (pads) against which probes are respectively pressed upon testing semiconductor memory circuits 1 and to which wires for connecting to lead terminals are respectively electrically connected upon packaging. Since the fifth embodiment is identical or similar in other configuration to the second embodiment, its detailed description will be omitted.

The semiconductor memory device according to the fifth embodiment of the present invention is shaped in the form of a square. The five first pads 4d are divided into groups of two pads and three pads and disposed in two rows parallel to one side of the outer periphery of the semiconductor memory device. Since the semiconductor memory device is square-shaped, the first pads 4d are placed in parallel with the opposed two sides of the outer periphery of the semiconductor memory circuit as a result of the placement of the first pads 4d in parallel with one side of the outer periphery of the semiconductor memory circuit. Further, the five first pads 4d are disposed so that row coordinates (corresponding to coordinates in the direction indicated by X in FIG. 6) of the respective first pads 4d are different from each other. Further, each of the first pads 4d comprises a probe region 4d1 against which a probe is pressed upon testing the semiconductor memory circuit 1, and a wire region 4d2 to which a wire for connecting to the lead terminal is electrically connected upon packaging. Each first pad 4d is greater than one employed in the prior art in area.

The operation of the present embodiment will next be described.

When the semiconductor memory circuits is tested, the probes 8a are respectively pressed against the first pads 4d respectively disposed within the two semiconductor devices continuously located in the direction normal to the direction in which the first pads 4d are in a line. In this condition, the two semiconductor memory devices are simultaneously tested. Since the five first pads 4d are divided into groups of two pads and three pads and arranged in two rows parallel to one side of the outer periphery and the five first pads 4d are placed so that the row coordinates of the respective first pads 4d differ from each other, the probes 8a are pressed against one semiconductor memory device from one of two directions opposed to each other, whereas the probes 8a are pressed against the other semiconductor memory device from the other of the opposed two directions.

Thus, the fifth embodiment can obtain an advantageous effect in that since the five first pads 4d are divided into the groups of two and three and disposed in two rows in parallel with one side of the outer periphery and the five first pads 4d are placed so that the row coordinates of the respective first pads 4d are made different from one another, the two semiconductor memory devices can be simultaneously tested upon testing the semiconductor memory circuits.

Further, the fifth embodiment can bring about an advantageous effect in that since each of the first pads 4d comprises the probe region 4d1 against which the probe is pressed upon testing the semiconductor memory circuit 1 and the wire region 4d2 to which the wire for connecting to the lead terminal is electrically connected upon packaging, the wire for connecting to the lead terminal can be electrically connected to the wire region 4d2 different from the probe region 4d1 provided with a probe contact trace produced by pressing the probe against the probe region 4d1, and the wire for connecting to the lead terminal is no longer hard to connect to the first pad 4d, in a manner similar to the third embodiment (see FIGS. 4A and 4B).

Sixth Embodiment

Figure 7:
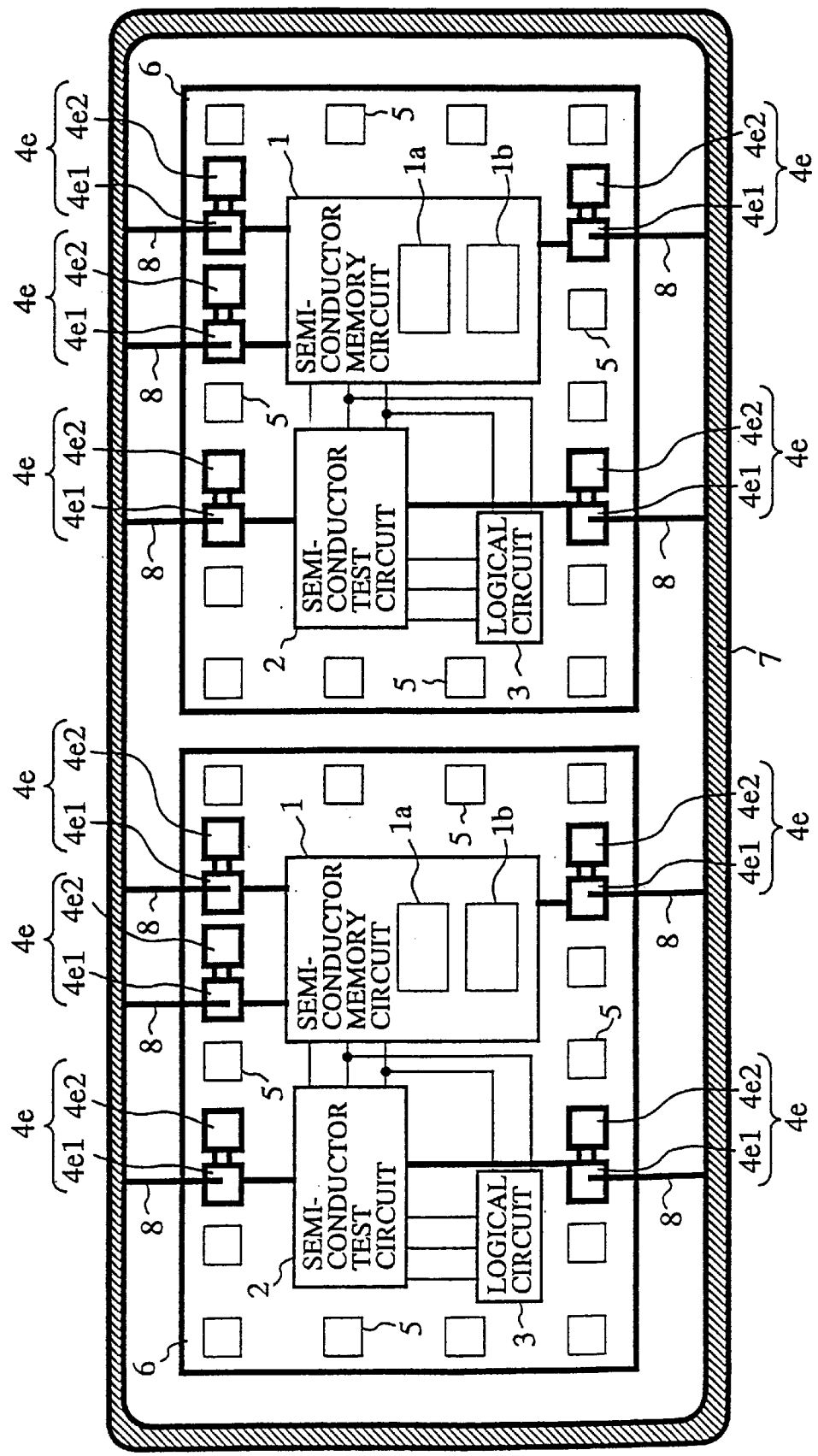
FIG. 7 is a plan view showing a configuration of a semiconductor memory device according to a sixth embodiment of the present invention.

FIG. 7 is a plan view illustrating a configuration of a semiconductor memory device according to a sixth embodiment of the present invention. FIG. 7 shows the manner in which semiconductor memory circuits are being tested while pressing probes against five first pads respectively provided at two of a plurality of semiconductor memory devices formed on a semiconductor wafer, viewed through a window hole defined substantially in the center of a probe card. The plurality of semiconductor memory devices formed on the semiconductor wafer are divided into individual semiconductor memory devices in the subsequent dicing process. In FIG. 7, reference numerals 4e respectively denote first pads (pads) against which probes are respectively pressed upon testing semiconductor memory circuits 1 and to which wires for connecting to lead terminals are respectively electrically connected upon packaging. Since the sixth embodiment is identical or similar in other configuration to the first embodiment, its detailed description will be omitted.

The semiconductor memory device according to the sixth embodiment of the present invention is shaped in the form of a square. The five first pads 4e are divided into groups of two pads and three pads and disposed in two rows parallel to one side of the outer periphery of the semiconductor memory device. Since the semiconductor memory device is square-shaped, the first pads 4e are placed in parallel with the opposed two sides of the outer periphery thereof as a result of the placement of the first pads 4e in parallel with one side of the outer periphery thereof. Further, each of the first pads 4e comprises a probe pad 4e1 electrically connected to a wire pad 4e2, against which a probe is pressed upon testing the semiconductor memory circuit 1, and the wire pad 4e2 to which a wire for connecting to the lead terminal is electrically connected upon packaging.

The operation of the present embodiment will next be explained.

When the semiconductor memory circuit is tested, the probes 8 are respectively pressed against the probe pads 4e1 of the first pads 4e respectively disposed within the two semiconductor memory devices continuously located in the direction in which the first pads 4e are in a row. In this condition, the two semiconductor memory devices are simultaneously tested. Since the five first pads 4e are divided into the two and three and arranged in two rows so as to run parallel with one side of the outer periphery, the probes 8 are pressed against the respective semiconductor memory devices from two directions opposed to each other.

Thus, the sixth embodiment can obtain an advantageous effect in that since the five first pads 4e are divided into the groups of two pads and three pads and disposed in two rows so as to run parallel with one side of the outer periphery, the two semiconductor memory devices can be simultaneously tested upon testing the semiconductor memory circuits.

Further, the sixth embodiment can bring about an advantageous effect in that since each of the first pads 4e comprises the probe pad 4e1 electrically connected to the wire pad 4e2, against which the probe is pressed upon testing the semiconductor memory circuit 1 and the wire pad 4e2 to which the wire for connecting to the lead terminal is electrically connected upon packaging, a wire 12a for connecting to the lead terminal can be electrically connected to the wire pad 4e2 different from the probe pad 4e1 provided with a probe contact trace 11a produced by pressing the probe against the probe pad 4e1, and the wire 12a for connecting to the corresponding lead terminal is no longer hard to connect to the first pad 4e, as shown in FIGS. 8A and 8B. Incidentally, FIG. 8 is a schematic view showing the state of the first pad 4e and the wire 12a at the time that the wire 12a for connecting to the lead terminal is electrically connected to the first pad 4e, in which FIG. 8A is a side view and FIG. 8B is a plan view.

Seventh Embodiment

Figure 9:
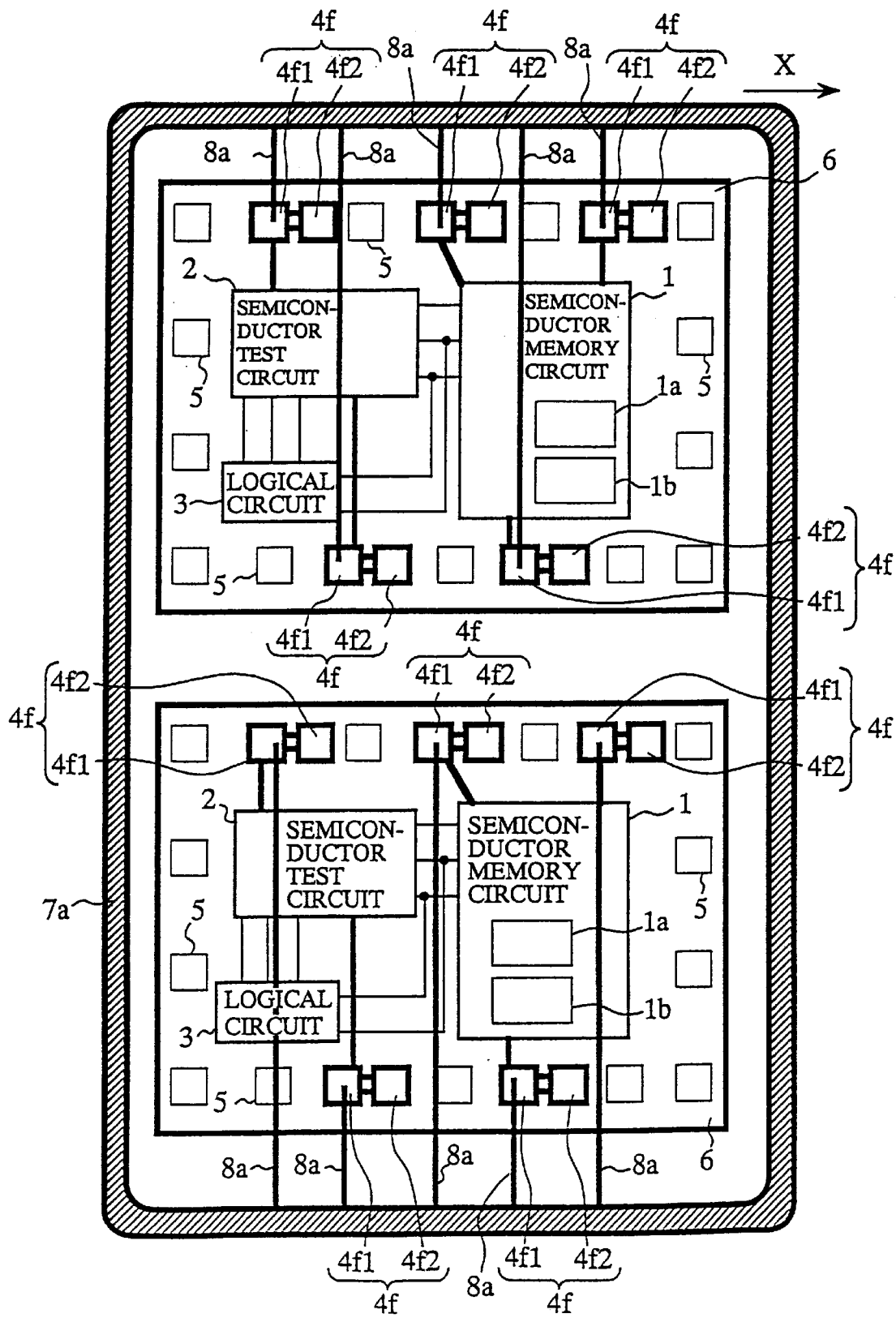
FIG. 9 is a plan view depicting a configuration of a semiconductor memory device according to a seventh embodiment of the present invention.

FIG. 9 is a plan view showing a configuration of a semiconductor memory device according to a seventh embodiment of the present invention. FIG. 9 shows the manner in which semiconductor memory circuits are being tested while pressing probes against five first pads respectively provided at two of a plurality of semiconductor memory devices formed on a semiconductor wafer, is viewed through a window hole defined substantially in the center of a probe card. The plurality of semiconductor memory devices formed on the semiconductor wafer are divided into individual semiconductor memory devices in the subsequent dicing process. In FIG. 9, reference numerals 4f respectively denote first pads (pads) against which probes are respectively pressed upon testing semiconductor memory circuits 1 and to which wires for connecting to lead terminals are respectively electrically connected upon packaging. Since the seventh embodiment is identical or similar in other configuration to the second embodiment, its detailed description will be omitted.

The semiconductor memory device according to the seventh embodiment of the present invention is shaped in the form of a square. The five first pads 4f are divided into groups of two pads and three pads and disposed in two rows parallel to one side of the outer periphery of the semiconductor memory device. Since the semiconductor memory device is square-shaped, the first pads 4f are placed in parallel with the opposed two sides of the outer periphery thereof as a result of the placement of the first pads 4f in parallel with one side of the outer periphery thereof. Further, the five first pads 4f are disposed so that row coordinates (corresponding to coordinates in the direction indicated by X in FIG. 9) of the respective first pads 4f are different from each other. Further, each of the first pads 4f comprises a probe pad 4f1 electrically connected to a wire pad 4f2, against which a probe is pressed upon testing the semiconductor memory circuit 1, and the wire pad 4f2 to which a corresponding wire for connecting to the lead terminal is electrically connected upon packaging.

The operation of the present embodiment will next be described.

When each of the semiconductor memory circuits is tested, the probes 8a are respectively pressed against the first pads 4f respectively disposed within the two semiconductor memory devices continuously located in the direction normal to the direction in which the first pads 4f are in a line. In this condition, the two semiconductor memory devices are simultaneously tested. Since the five first pads 4f are divided into the groups of two pads and three pads arranged in two rows parallel to one side of the outer periphery and the five first pads 4f are placed therein so that the row coordinates of the respective first pads 4f differ from each other, the probes 8a are pressed against one semiconductor memory device from one of two directions opposed to each other, whereas the probes 8a are pressed against the other semiconductor memory device from the other of the opposed two directions.

Thus, the seventh embodiment can obtain an advantageous effect in that since the five first pads 4f are divided into the groups of two pads and three pads and disposed in two rows parallel to one side of the outer periphery and the five first pads 4f are placed so that the row coordinates of the respective first pads 4f differ from one another, the two semiconductor memory devices can be simultaneously tested upon testing the semiconductor memory circuits.

Further, the seventh embodiment can bring about an advantageous effect in that since each of the first pads 4f comprises the probe pad 4f1 electrically connected to the wire pad 4f2, against which the probe is pressed upon testing the semiconductor memory circuit 1, and the wire pad 4f2 to which the wire for connecting to the lead terminal is electrically connected upon packaging, the wire for connecting to the lead terminal can be electrically connected to the wire pad 4f2 different from the probe pad 4f1 provided with a probe contact trace produced by pressing the probe against the probe pad 4f1, and the wire for connecting to the lead terminal is no longer hard to connect to the first pad 4f, in a manner similar to the sixth embodiment (see FIGS. 8A and 8B).

Incidentally, the above-described first, fourth and sixth embodiments have described the case in which the first pads are arranged in two rows so as to run parallel with one side of the outer periphery. However, the same advantageous effect as described above can be obtained even if the first pads are aligned in a row in parallel with one side of the outer periphery. Further, the aforementioned second, fifth and seventh embodiments have described the case in which the first pads are placed in two rows in parallel with one side of the outer periphery. However, even if the first pads are aligned in three or more rows in parallel with one side of the outer periphery, the same advantageous effect as described above can be brought about.

The aforementioned respective embodiments have also described the case in which the first pads are disposed along the outer peripheral side. However, even if the first pads are centrally placed, the same advantageous effect as described above can be obtained.

Further, the above-described embodiments have described the case in which the logical circuits are provided as semiconductor circuits other than the semiconductor memory circuits and the semiconductor test circuits. However, even if a microprocessor and an analog circuit are provided as the semiconductor circuits other than the semiconductor memory circuits and the semiconductor test circuits, the same advantageous effect as described above can be brought about.

Moreover, semiconductor memory circuits each having a bus width of 32 bits or more may be used as the semiconductor memory circuits employed in the aforementioned respective embodiments.

While the preferred embodiments of the present invention have been described above, the description of these is illustrated ones. It should be understood that modifications and changes from these description can be made without departing from the spirit and scope of the following claims.

What is claimed is:

1. A semiconductor memory device comprising:

a semiconductor substrate;

a semiconductor memory circuit including a first memory circuit and a second memory circuit used for replacing said first memory circuit when said first memory circuit fails to function properly;

a semiconductor test circuit for testing said semiconductor memory circuit;

a semiconductor circuit coupled to said semiconductor memory circuit and to said semiconductor test circuit; and a plurality of pads for contact by probes during testing of said semiconductor memory circuit and for connection to wires connected to lead terminals during packaging of said semiconductor memory device, said semiconductor memory circuit, said semiconductor test circuit, and said semiconductor circuit, said plurality of pads being located on said semiconductor substrate, and said plurality of pads being arranged in at least two rows, each row having a row direction parallel to a first side of an outer periphery of said semiconductor memory device, wherein none of said pads in different rows are aligned along directions perpendicular to the row direction.

2. The semiconductor memory device according to claim 1, wherein each of said pads comprises a probe region for contact by a probe during testing and a wire region for connection to a wire during packaging.

3. The semiconductor memory device according to claim 1, wherein each of said pads comprises a probe pad for contact by a probe during testing and a wire pad for connection to a wire during packaging, said probe pads and said wire pads being electrically connected to each other.

* * * * *